United States Patent
Lee et al.

(10) Patent No.: US 9,922,922 B1
(45) Date of Patent: Mar. 20, 2018

(54) MICROCHIP WITH CAP LAYER FOR REDISTRIBUTION CIRCUITRY AND METHOD OF MANUFACTURING THE SAME

(71) Applicant: OmniVision Technologies, Inc., Santa Clara, CA (US)

(72) Inventors: Chi-Kuei Lee, Taoyuan (TW); Ying Chung, Taichung (TW); Ying-Chih Kuo, Hsinchu (TW); Wei-Feng Lin, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/268,169

(22) Filed: Sep. 16, 2016

(51) Int. Cl.
| | |
|---|---|
| *H01L 23/498* | (2006.01) |
| *H01L 21/56* | (2006.01) |
| *H01L 23/00* | (2006.01) |
| *H01L 21/02* | (2006.01) |
| *H01L 23/31* | (2006.01) |

(52) U.S. Cl.
CPC .. *H01L 23/49838* (2013.01); *H01L 21/02274* (2013.01); *H01L 21/56* (2013.01); *H01L 23/3171* (2013.01); *H01L 24/03* (2013.01); *H01L 24/06* (2013.01); *H01L 2224/0401* (2013.01)

(58) Field of Classification Search
CPC ......... H01L 27/06; H01L 21/02; H01L 24/02; H01L 24/05; H01L 24/45; H01L 23/522; H01L 21/3205; H01L 21/768; H01L 23/49838; H01L 21/56; H01L 24/06; H01L 24/03; H01L 21/02274; H01L 23/3171; H01L 2224/0401

USPC ........................................ 257/773, 774, 731
See application file for complete search history.

(56) References Cited

U.S. PATENT DOCUMENTS

| 7,115,496 B2 | 10/2006 | Brintzinger et al. |
| 2008/0081457 A1* | 4/2008 | Lin .................. H01L 21/76816 438/614 |

(Continued)

OTHER PUBLICATIONS

Curley, Ronald, Thomas McCormack, and Matthew Phipps; "Low-pressure CVD and Plasma-Enhanced CVD"; http://www.ece.umd.edu/class/enee416/GroupActivities/LPCVD-PECVD.pdf; Accessed Nov. 2, 2017; 5 pages.

*Primary Examiner* — Alexander Oscar Williams
(74) *Attorney, Agent, or Firm* — Larry E. Henneman, Jr.; Gregory P. Gibson; Henneman & Associates, PLC

(57) ABSTRACT

A microchip includes a passivation layer formed over underlying circuitry, a redistribution layer formed over the passivation layer, and a cap layer formed over the redistribution conductors of the redistribution layer and in contact with the passivation layer. The passivation layer and the cap layer have one or more compatibilities that provide sufficient adhesion between those two layers to prevent metal migration from the conductors of the redistribution layer between the interfaces of the passivation and cap layers. In one embodiment, the passivation and cap layers are each formed from an inorganic oxide (e.g., SiO$_2$) using a process (e.g., PECVD) that provides substantially-uniform step coverage by the cap layer in trench and via regions of underlying circuitry. The invention increases the reliability of the microchip, because it eliminates metal migration, and the electrical shorting caused therefrom, in the redistribution layer.

20 Claims, 11 Drawing Sheets

(56) References Cited

U.S. PATENT DOCUMENTS

| | | | |
|---|---|---|---|
| 2010/0246152 A1* | 9/2010 | Lin | H01L 23/60 |
| | | | 361/783 |
| 2013/0032923 A1* | 2/2013 | Lin | H01L 28/10 |
| | | | 257/531 |
| 2013/0320536 A1* | 12/2013 | Cooney, III | H01L 23/5227 |
| | | | 257/751 |
| 2016/0181184 A1* | 6/2016 | Matsumoto | H01L 24/03 |
| | | | 257/751 |
| 2016/0379946 A1* | 12/2016 | Maekawa | H01L 24/02 |
| | | | 257/773 |
| 2017/0040266 A1* | 2/2017 | Lin | H01L 23/5384 |

* cited by examiner

MICROCHIP WITH CAP LAYER FOR REDISTRIBUTION CIRCUITRY AND METHOD OF MANUFACTURING THE SAME

BACKGROUND OF THE INVENTION

Field of the Invention

This invention relates generally to microchip fabrication, and more particularly to preventing electrical shorts in the redistribution layer (RDL) circuitry of microchips.

Description of the Background Art

FIG. 1 shows a microchip 100 mounted on a printed circuit board (PCB) 102. Such microchip-PCB assemblies are used in a wide variety of electronic devices (e.g., digital cameras, computers, etc.). PCB 102 includes a plurality of conductive traces 104 and a plurality of solder pads 106 that electrically interconnect the electronic components (e.g., microchip 100, passive components 108, other active components 110, etc.) mounted thereon. Conductive traces 104 interconnect different regions of PCB 102, and solder pads 106 facilitate electrical connections (e.g., by soldering) with complementary electrical terminals on the electronic components mounted on PCB 102. The layout and circuitry of PCB 102 are not particularly relevant to the present invention and, therefore, is shown representationally in character only.

FIG. 2 shows a bottom surface 202 of microchip 100 in greater detail. Bottom surface 202 includes a plurality of solder balls 204 formed thereon, which are used to electrically connect microchip 100 to a complementary plurality of solder pads 106 of PCB 102. FIG. 2 also shows a detail 206 of a portion of microchip 100. Detail 206 shows that microchip 100 includes circuitry (shown in dashed lines), which is covered by bottom surface 202. This circuitry includes a plurality of input-output (I/O) terminals 208 (only two shown), a plurality of redistribution conductors 210 (only two shown), and a plurality of solder pads 212 (only one shown) having solder balls 204 formed thereon. I/O terminals 208 facilitate communication between the integrated circuitry of microchip 100A and an external device. Redistribution conductors 210 route the electrical signals from I/O terminals 208 to respective solder pads 212 and, therefore, redistribute the I/O nodes of microchip 100 from the locations of I/O terminals 208 to the locations of solder pads 212. For example, redistribution conductor 210(1) electrically connects I/O terminal 208(1) with solder pad 212(1), thereby relocating the I/O node defined by terminal 208(1) to the location of solder pad 212(1). Redistribution conductor 210(2) similarly connects I/O terminal 208(2) with another solder pad (not shown in detail 206).

FIG. 3A is a cross-sectional view showing of a portion of microchip 100 taken along section line A-A of FIG. 2 according to a first embodiment of the prior art. Accordingly, microchip 100 is designated as microchip 100A in FIG. 3A.

Microchip 100A includes a substrate 214, integrated circuitry 216 formed on substrate 214, a metallization layer 218 formed over integrated circuitry 216, a first solder mask layer 220, a redistribution layer (RDL) 222, and a second solder mask layer 224. Metallization layer 218 interconnects various elements of integrated circuitry layers 216, provides voltage to the integrated circuitry of integrated circuitry layers 216, etc. as is known in the art. Here, metallization layer 218 includes I/O terminals 208 (FIG. 2) and other wiring 226.

First solder mask layer 220 is formed from a solder mask (e.g., an organic epoxy resin, etc.) over the I/O terminals 208 and wiring 226 of metallization layer 218 to electrically isolate portions of metallization layer 218 from RDL 222. Unfortunately, because first solder mask layer 220 is applied using a spin-on or spray-coating method, solder mask layer 220 has non-uniform step coverage at via and trench regions of metallization layer 218. This non-uniform step coverage is illustrated representationally in FIG. 3A at trench regions 228 and 230. Trench region 230 is located between adjacent wirings 226 that are close together. Such closely-oriented elements are particularly problematic because a key-hole has formed in solder mask layer 220. Trench region 230 also indicates the non-uniform step coverage that can occur within vias (not otherwise shown).

Redistribution layer (RDL) 222 includes a plurality of conductive elements that redistribute the locations of the I/O nodes of microchip 200. Here, RDL 222 includes the plurality of conductors 210 and the plurality of solder pads 212. (Only two conductors 210(1-2) and one solder pad 212(1) are shown in FIG. 3A.) A plurality of vias 232 (only one shown in FIG. 3A) is formed through first solder mask layer 220 to electrically couple conductors 210 with their respective I/O terminals 208. Each solder pad 212 is electrically coupled to one of conductors 210 (FIG. 2) and has a solder ball 204 (solder ball 204(1) shown in detail) formed thereon.

Second solder mask layer 224 is formed from a solder mask material (e.g., an organic epoxy resin) over first solder mask layer 220, conductors 210, and solder pad 212 to protect microchip 100A during soldering. Second solder mask layer 224 is also formed from a spin-on or spray coating process and contributes to the non-uniformity of first solder mask layer 220, for example, because it closes off key-hole 230 and creates a void. Additionally, the non-uniformity of first solder mask layer 220 can contribute to the non-uniformity of bottom surface 202.

In summary, utilizing two solder mask layers 220 and 224 in microchip 100A is useful for protecting the underlying circuitry from damage during soldering. However, first and second solder mask layers 220 and 224 provide non-uniform step coverage at trench regions and vias of metallization layer 218. Such non-uniformity can cause premature failure of microchip 100A.

FIG. 3B is a cross-sectional view of a second embodiment of the prior art microchip 100B taken along section line A-A of FIG. 2. Microchip 100B is similar to microchip 100A, except that microchip 100B includes a passivation layer 234 formed over the I/O terminals 208 and wiring 226 of metallization layer 218. Passivation layer 234 is an oxide layer having a plurality of vias 236 (only one shown) formed therethrough to enable conductors 210 to be electrically coupled with respective I/O terminals 208. A solder mask layer 238 is formed over passivation layer 234, conductors 210, and solder pads 212.

Utilizing an oxide passivation layer 234 and a solder mask layer 238 in microchip 100B is useful for protecting the circuitry from damage during soldering and packaging and for providing planarized coverage of trench and via regions. Therefore, the oxide passivation layer 234 in FIG. 3B is used in microchips made with through-silicon-via (TSV) technology. However, the structure shown in FIG. 3B has been found to result in short circuits between the conductors 210 of the redistribution layer 222 and premature device failures, especially when microchip 100B is exposed to environments with extreme temperatures and humidity (e.g., during temperature-humidity bias (THB) testing, etc.).

What is needed, therefore, is a microchip design that is more reliable, especially when exposed to extreme temperatures and very humid environments. What is also needed is a microchip design that provides more robust redistribution layer(s).

SUMMARY

The present invention overcomes the problems associated with the prior art by providing a microchip that is reliable when exposed to extreme temperatures and humidity. The invention prevents metal migration and short circuits in the redistribution layer of a microchip by providing isolation layers that have improved adhesion at their interfaces around the redistribution circuitry.

A method of fabricating a microchip includes the steps of providing a substrate having circuitry formed thereon, forming a passivation layer (e.g., one with substantially planarizing step coverage, etc.) over the circuitry, and forming a second set of electrical contacts over the passivation layer. The circuitry includes a first set of electrical contacts that is configured to communicate with an external device, whereas the second set of electrical contacts are configured to be electrically coupled to a set of complementary electrical contacts of the external device. The method also includes the step of forming a set of redistribution conductors over the passivation layer, where each of the redistribution conductors is formed from a conductive material and electrically couples at least one of the electrical contacts of the first set with one of the electrical contacts of the second set, and the step of forming a cap layer over the set of redistribution conductors and in contact with the passivation layer. Additionally, the passivation layer and the cap layer have at least one compatibility that facilitates an amount of adhesion therebetween sufficient to prevent migration of the conductive material between interfaces of the passivation layer and the cap layer. A particular method further includes a step of forming a protective layer over the cap layer, where the protective layer is formed from a material different than the cap layer. In another particular method, each of the electrical contacts of the second set is free of contact with the cap layer.

In one particular method, the compatibility discussed above can comprise type of material. More particularly, the passivation layer and the cap layer can be formed from the same material (e.g. from an oxide, etc.). In another (or more) particular method, the at least one compatibility can include type of deposition process. For example, the steps of forming the passivation layer and forming the cap layer can be accomplished using a same type of deposition process (e.g., plasma-enhanced chemical vapor deposition (PECVD)).

A microchip according to the invention includes a substrate (e.g., a silicon substrate, etc.) having circuitry formed thereon, a passivation layer (e.g., one with substantially planarizing step coverage, etc.) formed over the circuitry, and a second set of electrical contacts disposed over the passivation layer. The circuitry includes a first set of electrical contacts configured to communicate with an external device, whereas the second set of electrical contacts is configured to be electrically coupled to a set of complementary electrical contacts of the external device. Such a microchip of the invention also includes a set of redistribution conductors disposed over the passivation layer and a cap layer formed over the set of redistribution conductors and in contact with the passivation layer, where each of the redistribution conductors is formed from a conductive material and electrically couples at least one of the electrical contacts of the first set and one of the electrical contacts of the second set. Furthermore, the passivation layer and the cap layer have at least one compatibility that facilitates an amount of adhesion therebetween sufficient to prevent migration of the conductive material between interfaces of the passivation layer and the cap layer. In a particular embodiment, the microchip also includes a protective layer over the cap layer, where the protective layer is formed from a material (e.g., solder mask) that is different than the cap layer. In another particular embodiment, there is a gap between the cap layer and each of the electrical contacts of the second set.

As above, in a particular embodiment, the compatibility can include type of material, and in a more particular embodiment, the passivation layer and the cap layer are formed from the same material (e.g., an oxide such as $SiO_2$, etc.). Additionally, the passivation layer can have a thickness in the range of 2.0 to 5.0 micrometers and/or the cap layer can have a thickness in the range of 0.5 to 2.0 micrometers. In another (or more particular) embodiment, the compatibility includes type of deposition process. For example, the passivation layer and the cap layer can be formed using a same type of deposition process (e.g., PECVD).

Another embodiment of a microchip according to the invention includes a substrate having circuitry formed thereon as discussed above, an inorganic passivation layer formed over the circuitry, and a second set of electrical contacts as discussed above formed over the passivation layer. Such a microchip also includes a set of redistribution conductors formed on the passivation layer and an inorganic cap layer formed in contact with the passivation layer and over the set of redistribution conductors, where each of the redistribution conductors electrically couples at least one of the electrical contacts of the first set and one of the electrical contacts of the second set. In one particular embodiment, each of the passivation layer and the cap layer is formed from an inorganic oxide, and in another particular embodiment, the microchip further includes a protective layer over the cap layer, where the protective layer is formed from a material (e.g., an organic solder mask, etc.) that is different than the cap layer.

Still another microchip of the invention includes a substrate having circuitry formed thereon and a redistribution layer, where the circuitry includes a first set of electrical contacts configured to communicate with an external device. Additionally, the redistribution layer includes a second set of electrical contacts configured to be electrically coupled to a set of complementary electrical contacts of the external device and a set of redistribution conductors formed from a conductive material and electrically coupling ones of the electrical contacts of the first set and ones of the electrical contacts of the second set. Such a microchip of the invention also includes means for isolating the set of redistribution conductors and for preventing migration of the conductive material between adjacent ones of the redistribution conductors.

BRIEF DESCRIPTION OF THE DRAWINGS

The present invention is described with reference to the following drawings, wherein like reference numbers denote substantially similar elements.

DETAILED DESCRIPTION

The present invention overcomes the problems associated with the prior art, by providing a microchip that is reliable when exposed to extreme temperature and high humidity. In the following description, numerous specific details are set forth (e.g., particular materials, structures, etc.) in order to provide a thorough understanding of the invention. Those skilled in the art will recognize, however, that the invention may be practiced apart from these specific details. In other instances, details of well-known microchip fabrication practices (e.g., formation of integrated circuitry, routine optimization, etc.) and components have been omitted, so as not to unnecessarily obscure the present invention.

Figure 4:
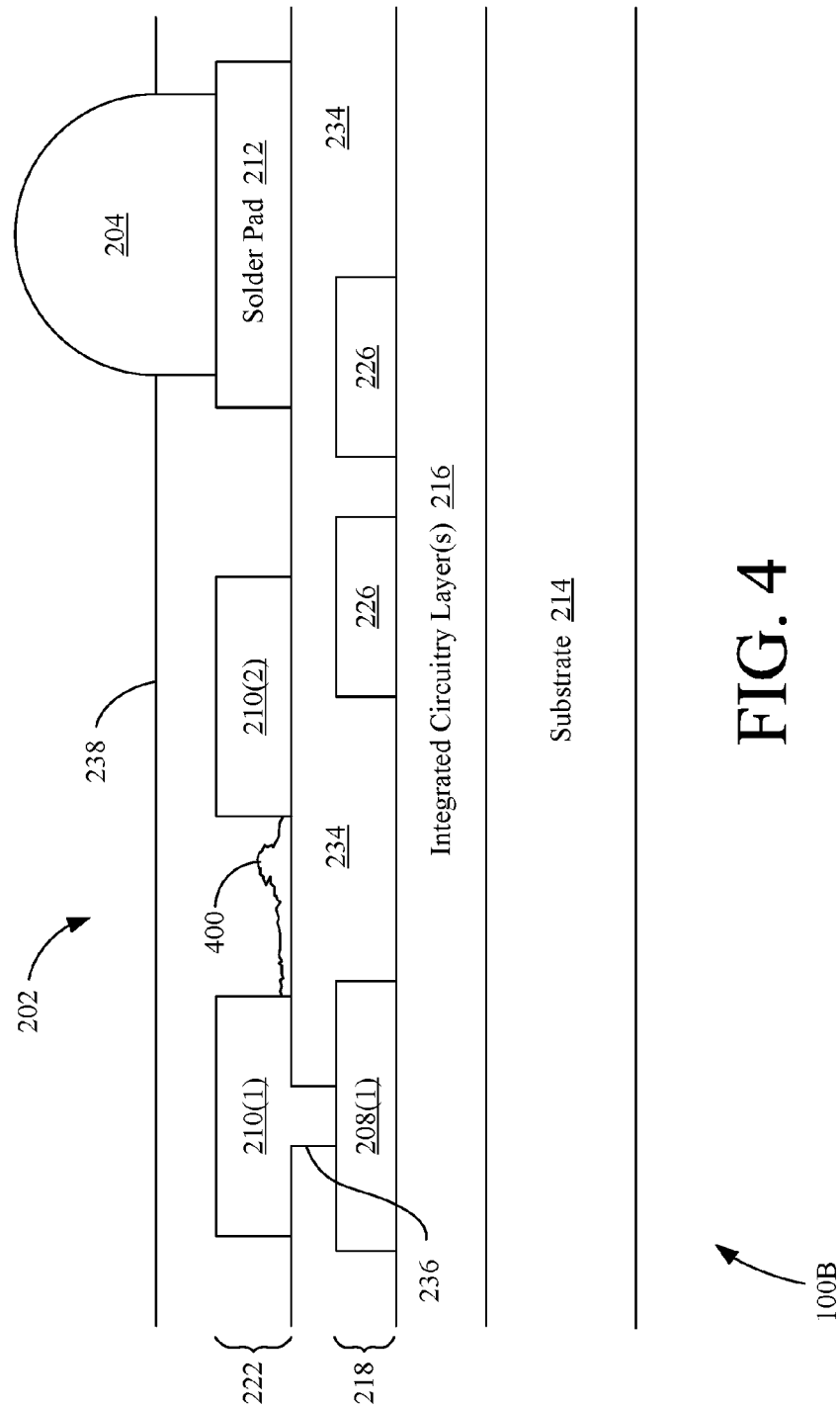
FIG. 4 is a cross-sectional view of a microchip showing metal migration between elements of a redistribution layer.

FIG. 4 shows a cross-section of microchip 100B. The inventors have determined that microchip 100B is unreliable in high temperature and humid environments, because the conductive material (e.g., metal) from which the conductors 210 of the redistribution layer 222 are formed migrates between sections of adjacent conductors 210(1) and 210(2). For example, conductors 210 can be formed from one or more layers of metal (e.g., nickel, copper, etc.), and the inventors have found that these metals migrate (or leak) between the interface of passivation layer 234 and solder mask layer 238. This migration creates a metal bridge 400, which causes an electrical short in the redistribution circuitry of microchip 100B. The inventors have further determined that such metal migration is caused by poor adhesion at the interfaces of oxide passivation layer 234 and solder mask layer 238 due to the incompatibility of the materials from which these layers are formed. Thus, the scope of the present invention includes improving the reliability of microchips by preventing metal migration between the conductive elements of the redistribution layer 222.

Figure 5:
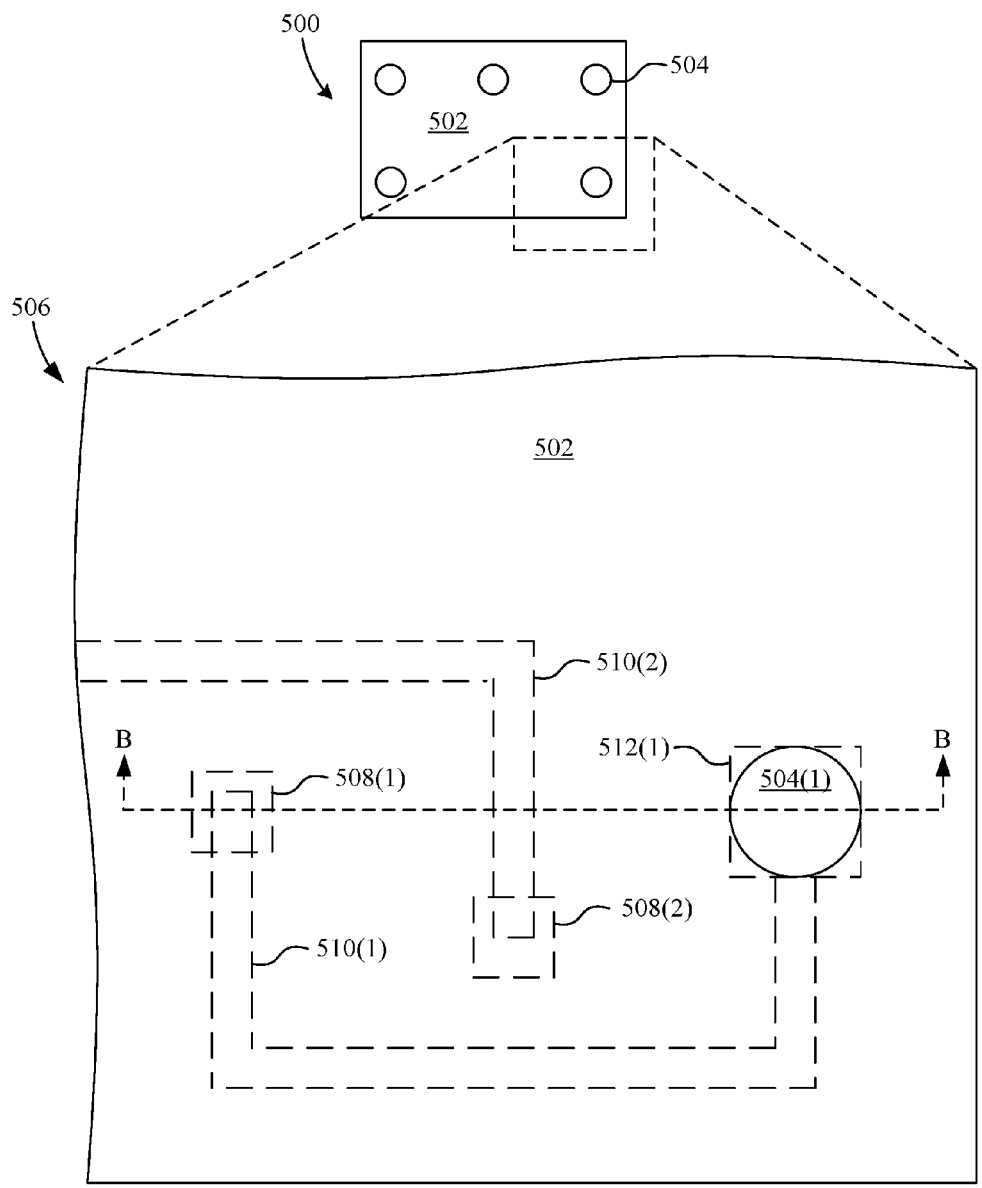
FIG. 5 is a bottom view a microchip according to the present invention.

FIG. 5 shows a microchip 500 according to an embodiment of the present invention. Microchip 500 includes a bottom surface 502, which has a plurality of solder balls 504 formed thereon. Only five solder balls 504 are shown in FIG. 5 for simplicity, but those skilled in the art will understand that microchip 500 could have a much larger number of solder balls 504.

FIG. 5 also includes a detail 506, which shows some circuitry (in dashed lines) formed under bottom surface 502. This circuitry includes a plurality of input-output (I/O) terminals 508 (only two shown in the detail), a plurality of redistribution conductors 510 (only two shown in the detail), and a plurality of solder pads 512 (only one shown in the detail), each of which has a solder ball 504 (only solder ball 504(1) shown in detail) formed thereon. I/O terminals 508 define a first set of electrical contacts that facilitate communication between the integrated circuitry (FIG. 6) of microchip 500 and an external device (e.g., a printed circuit board). Additionally, the plurality of solder pads 512 define a second set of electrical contacts, which are used to electrically connect microchip 500 to a complementary plurality of solder pads of the external device (e.g., a PCB). Each of redistribution conductors 510 is electrically coupled between one of I/O terminals 508 and one of solder pads 512, thus providing an electrical connection therebetween. For example, redistribution conductor 510(1) electrically connects I/O terminal 508(1) with solder pad 512(1), thereby relocating the I/O node defined by terminal 508(1) to the location of solder pad 512(1). Redistribution conductor 510(2) similarly connects I/O terminal 508(2) with another solder pad 512, which is not shown in detail 506. Thus, redistribution conductors 510 route the electrical signals from I/O terminals 508 to the plurality of solder pads 512 and, therefore, redistribute the I/O nodes of microchip 500 from the locations of I/O terminals 508 to the locations of solder pads 512. When microchip 500 is soldered onto a PCB via solder balls 502, the integrated circuitry of microchip 500 communicates with the PCB via the electrical connections established by I/O terminals 508, redistribution conductors 510, solder pads 512, and solder balls 502.

Conductors 510 and bond pads 512 define a redistribution layer 522 (FIG. 6) of microchip 500. As will be described in more detail below, microchip 500 includes means for isolating the elements of the redistribution layer and for preventing migration and bridging of conductive material between adjacent conductive elements of the redistribution layer 522. Accordingly, the invention provides a microchip with a more robust redistribution layer that is resistant to metal migration and short-circuit failure, especially when exposed to extreme (e.g., hot) temperatures and humidity.

Figure 6:
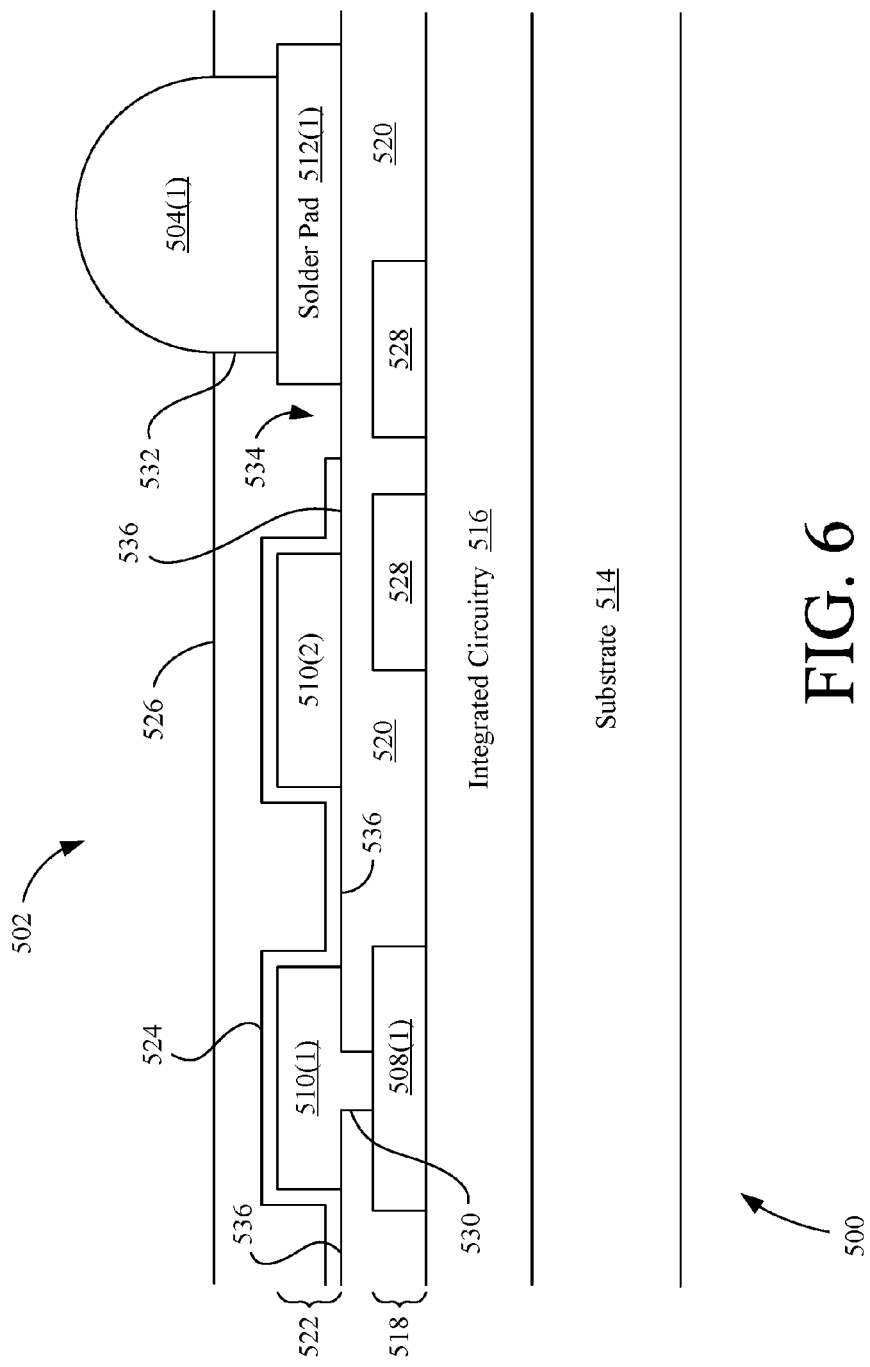
FIG. 6 is a cross sectional view, taken along line B-B, of a portion of the microchip of FIG. 5.

FIG. 6 is a cross-sectional view of microchip 500 taken along line B-B of FIG. 5. Microchip 500 is shown inverted in FIG. 6 with its bottom surface 502 facing upward, and therefore, the following description is made with respect to this inverted perspective.

Microchip 500 includes a substrate 514, integrated circuitry 516 formed in and/or on substrate 514, at least one metallization layer 518, a passivation layer 520, a redistribution layer 522, a cap layer 524, and a protective layer 526. In the present embodiment, substrate 514 is a silicon substrate, but use of other substrates is possible (e.g., another amorphous crystalline solid substrate, a plastic substrate, etc.). Integrated circuitry 516 represents various circuit elements (e.g. transistors, diodes, etc.) formed on or in substrate 514 by methods known in the art (e.g. doping, implantation, patterning, etc.).

Metallization layer 518 is formed over integrated circuitry 502 and functions to electrically interconnect the various elements of integrated circuitry 516 and/or to connect the integrated circuitry 516 to other elements (e.g., voltage sources, etc.) as is known in the art. Depending on the complexity and configuration of microchip 500, any number of metallization layers may be used, even though only one metallization layer 518 is shown in FIG. 6 for simplicity. Metallization layer 518 represents the metallization layer that is nearest to bottom surface 502 (e.g., the uppermost metallization layer in the view of FIG. 6) and includes I/O terminals 508, which enable integrated circuitry 516 to communicate with an external device (e.g. a PCB). Metallization layer 518 also includes other interconnect wiring 528, which is shown only representationally in FIG. 6.

Metallization layer 518 is formed from microchip fabrication techniques know in the art (e.g., plating, sputtering, etc.).

Passivation layer 520 is a first isolation layer formed over metallization layer 518 and functions to electrically isolate the conductive elements of redistribution layer 518 from the conductive elements of metallization layer 518. Passivation layer 520 also isolates metallization layer 518 and the elements below it from the environment. Passivation layer 520 defines a plurality of vias 530 therethrough (only one shown), each of which facilitates an electrical connection between an I/O terminal 508 (e.g., terminal 508(1)) and an associated redistribution conductor 510 (e.g., conductor 510(1)). In this embodiment, passivation layer 520 is formed from an inorganic oxide, such as silicon dioxide ($SiO_2$), using plasma-enhanced chemical vapor deposition (PECVD).

The PECVD-deposited, oxide passivation layer 520 provides substantially planarizing step coverage over trench and via regions of metallization layer 518 (e.g., between adjacent wirings 528, between adjacent I/O terminals 508(1), between adjacent I/O terminals 508 and wiring 528, within vias, etc.). Additionally, passivation layer 520 is formed at a thickness within a predetermined range (e.g., 2.0-5.0 micrometers, etc.).

Redistribution layer 522 is formed over passivation layer 520 and includes a plurality of redistribution conductors 510 and a plurality of solder pads 512 as mentioned above. Because microchip 500 has multiple solder pads 512 and, hence, multiple points for electrical contact to the external device, it will be understood that redistribution layer 522 can include a large number of redistribution conductors 510 routed to different areas of microchip 500. Thus, redistribution layer 522 shown in FIG. 6 is exemplary in nature.

The PECVD-deposited, oxide cap layer 524 is uniform in several respects. First, cap layer 524 provides substantially-uniform step coverage over trench and via regions of redistribution layer 522 (e.g., between adjacent conductors 510, within vias, etc.). Additionally, cap layer 524 is formed at a substantially-uniform thickness that is maintained within a predetermined range (e.g., 0.5-2.0 micrometers, etc.).

Like layer 520, the PECVD-deposited, oxide cap layer 524 is uniform in several respects. First, cap layer 524 provides substantially-uniform step coverage over trench and via regions of redistribution layer 522 (e.g., between adjacent conductors 510, within vias, etc.). Additionally, cap layer 524 is formed at a substantially-uniform thickness that is maintained within a predetermined range (e.g., 0.5-2.0 micrometers, etc.).

It should be further noted that cap layer 524 is formed to define a gap 534 between cap layer 524 and each of solder pads 512 and between cap layer 524 and each of solder balls 504. Gap 534 is formed all the way around the perimeter of solder pads 512 (FIG. 5), such that each solder pad 512 is free of cap layer 524. Cap layer 524 could alternatively be formed on the sides and/or top of solder pads 512, however, doing so has been found to cause solder balls 504 to fail from shear stress due to the presence of cap oxide and/or photoresist residue on solder pad 512. Accordingly, gap 534 improves the ability of solder balls 504 to withstand shear stress.

Importantly, passivation layer 520 and cap layer 524 have one or more compatibilities (e.g., material properties, properties resulting from formation, etc.) therebetween that promote strong adhesion at their interfaces 536. More particularly, the one or more compatibilities of passivation layer 520 and cap layer 524 provide sufficient adhesion therebetween to prevent conductive material from conductors 510 and/or from solder pads 512 from migrating between their interfaces 536, even in very humid and extreme (high) temperature environments. In other words, passivation layer 520 and cap layer 524 provide means for insulating and isolating redistribution conductors 510 and for preventing migration of conductive material between adjacent conductive elements of redistribution layer 522.

One such compatibility is type of material. In this embodiment, each of passivation layer 520 and cap layer 524 is made from the same inorganic oxide material, $SiO_2$. Accordingly, the oxide-oxide interfaces 536 have been found by the inventors to have sufficiently strong adhesion therebetween to prevent metal migration and bridging. Thus, the inventors have found that forming passivation layer 520 and cap layer 524 from material(s) having intrinsic properties that promote adhesion therebetween is important, whether or not those material(s) are the same or different. Such material(s) should also be selected to maintain sufficient adhesion to prevent metal migration even at extreme temperatures and humidity, such as those encountered during Temperature Humidity Bias (THB) or other reliability testing.

Another compatibility to be considered is type of deposition process. In this embodiment, each of passivation layer 520 and cap layer 524 is formed using the same type of deposition process: plasma-enhanced chemical vapor deposition (PECVD). PECVD facilitates formation of passivation layer 520 and cap layer 524, where each has a thickness maintained within a desired range for that layer. Additionally, PECVD facilitates formation of a passivation layer 520 having substantially planarizing coverage and a cap layer 524 having substantially-uniform step coverage over their respective underlying layers, which is particularly beneficial in microchips made using technologies that incorporate many vias. One such technology is through-silicon via (TSV) technology, which is commonly used to manufacture microchips used in automobiles and other regulated and/or professional applications. The above characteristics facilitate strong and consistent adhesion at interfaces 536. While PECVD is described in particular, other deposition methods could be used.

Thus, passivation layer 520 and cap layer 524 provide a homogenous environment that surrounds each of conductors 510 on all sides. For example, as shown in FIG. 6, conductors 510(1) and 510(2) are surrounded by oxide on their bottoms, tops, and sides. The strong oxide-oxide interfaces 536 of layers 520 and 524 prevent bridging and short circuits between adjacent conductors 510. These strong interfaces 536 also prevent conductive material from migrating from solder pads 512 (e.g., solder pad 512(1)) to a nearby redistribution conductor 510 (e.g., conductor 510(2)).

Figure 1:
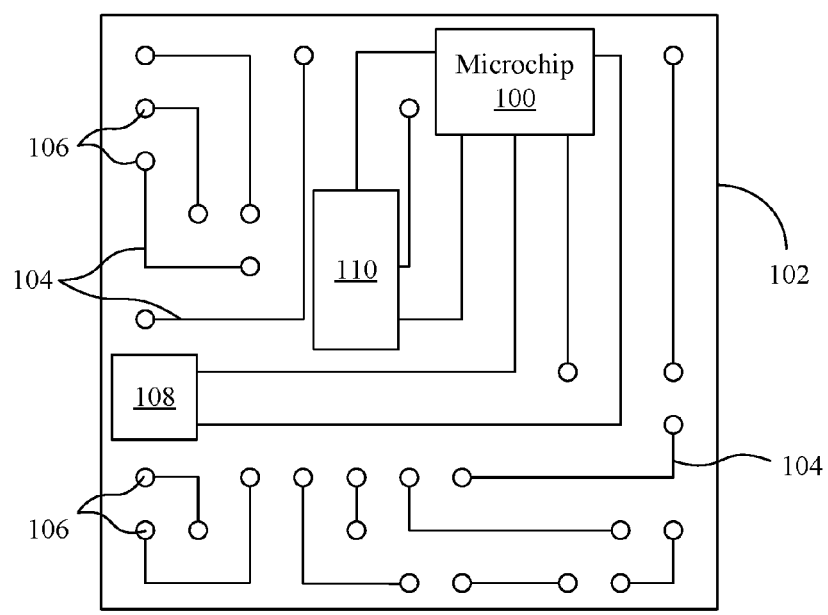
FIG. 1 is a top view of a printed circuit board and a microchip coupled thereto according to the prior art.
Figure 2:
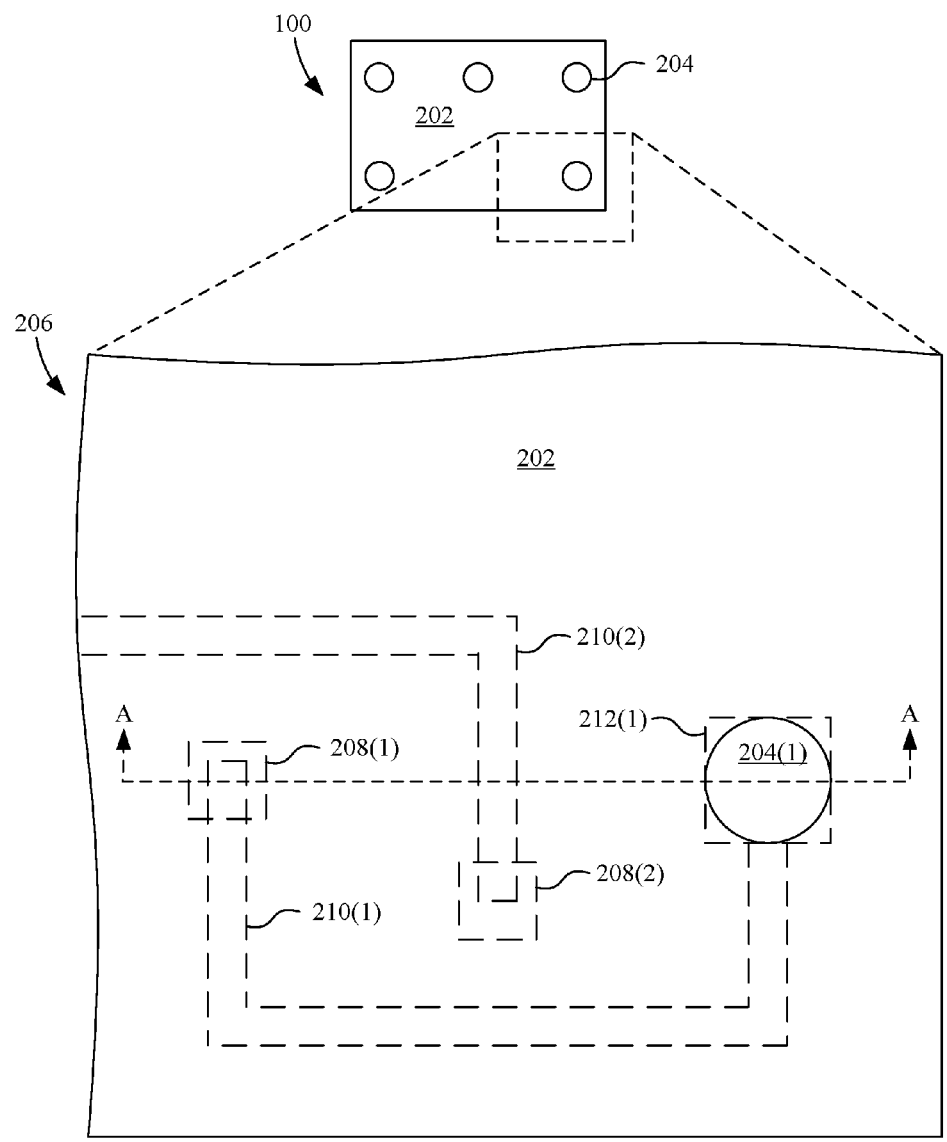
FIG. 2 is a view showing a bottom side of the microchip of FIG. 1A in greater detail.
Figure 3A:
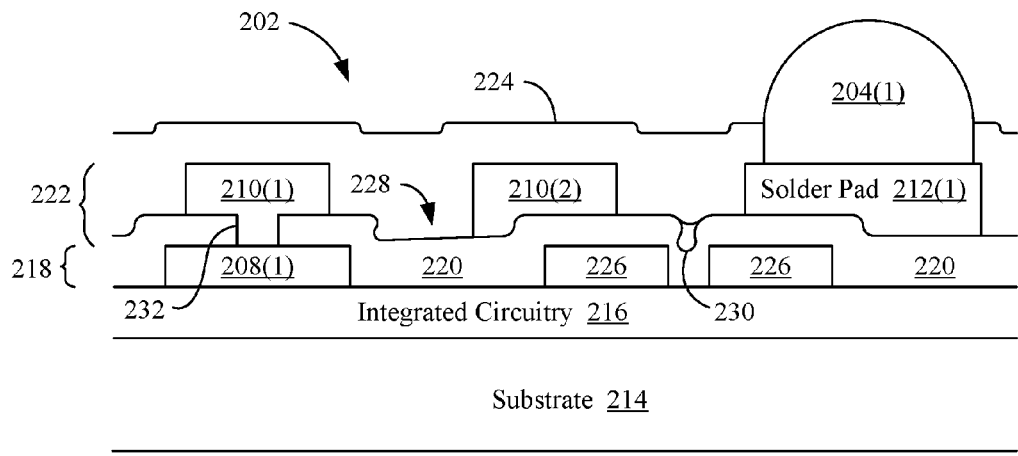
FIG. 3A is a cross-sectional view, taken along line A-A, of a portion of the microchip of FIG. 1A according to a first embodiment of the prior art.
Figure 3B:
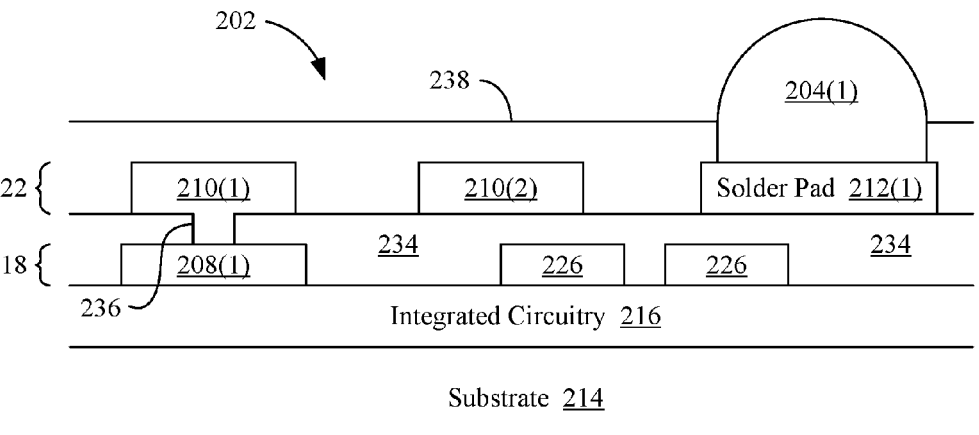
FIG. 3B is a cross-sectional view, taken along line A-A, of a portion of the microchip of FIG. 1A according to a second embodiment of the prior art.

The planarizing coverage of passivation layer 520 and the uniform step coverage of cap layer 524 also provide a more robust device than the prior art microchip 100A (FIG. 3A). For example, the non-uniform step coverage of first solder mask layer 220 of microchip 100A can cause shorts between metallization and redistribution layers 218 and 222, which are supposed to be isolated. Additionally, non-uniformities in second solder mask layer 224 can allow moisture to pass through and oxidize underlying circuitry (e.g., layers 222 and/or 218), which results in open-circuit and/or high-resistance failures. In contrast, the characteristics of the passivation and cap layers 520 and 524 discussed above alleviate such short circuits and device failures.

Protective layer 526 is formed over cap layer 508 and protects the underlying circuitry and layers from damage and electrical shorts that might otherwise occur during the process of electrically coupling microchip 500 to an external device. In this embodiment, protective layer 526 is formed from solder mask (e.g., organic epoxy resin, etc.) at a thickness, for example, between 5.0 and 50.0 micrometers. Vias 532 (only one shown) are formed through protective layer 526 to permit solder balls 504 to be formed on respective solder pads 512. Each solder ball 504 extends through solder mask layer 526 to permit solder ball 402 to be melted (e.g., reflowed) and adhered to a complementary electrical contact of the external, thereby creating an electrical connection between the microchip 500 and the external device.

Figure 7A:
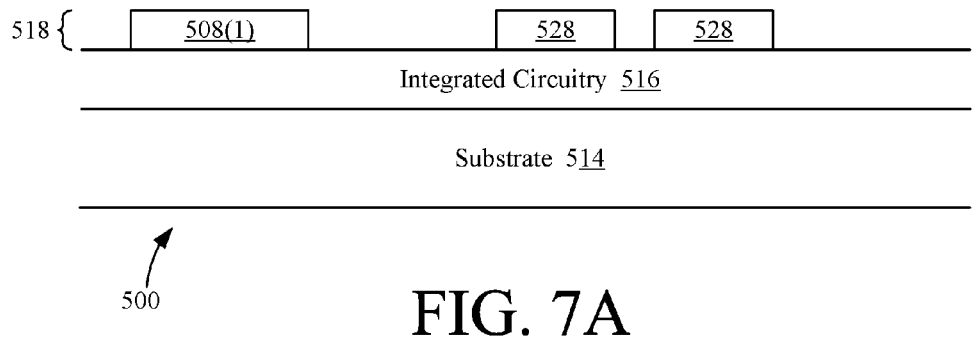
FIGS. 7A-7I are cross-sectional views showing the microchip of FIG. 5 at various stages of manufacture according to the present invention.
Figure 7B:
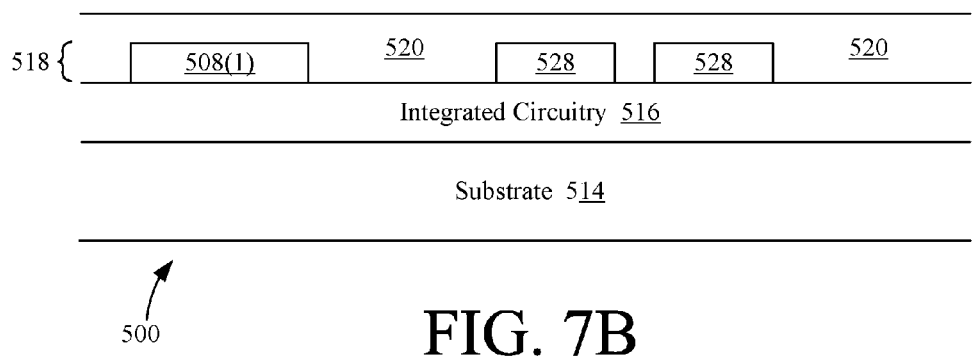
Figure 7C:
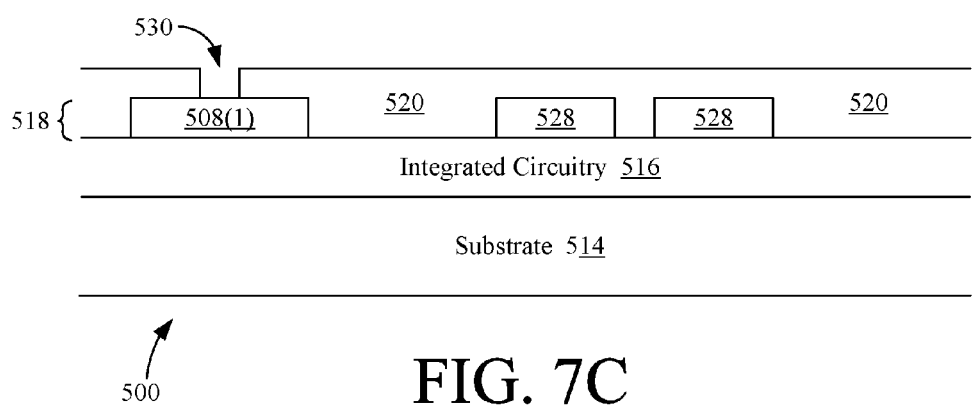
Figure 7D:
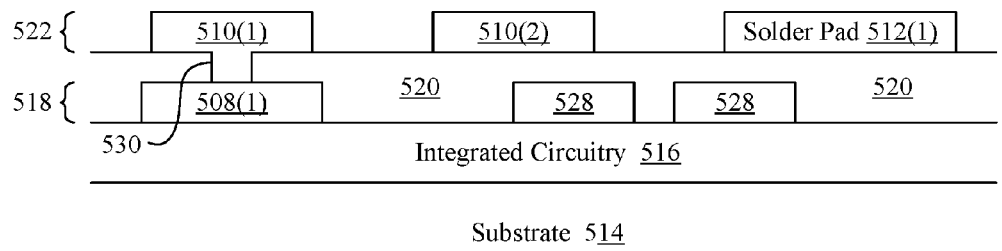
Figure 7E:
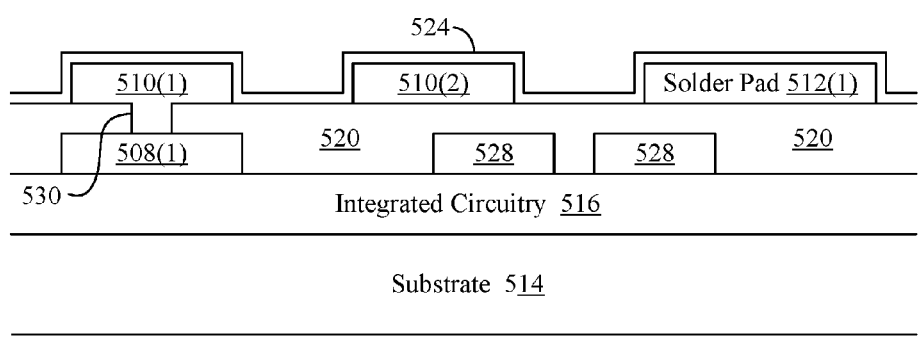
Figure 7F:
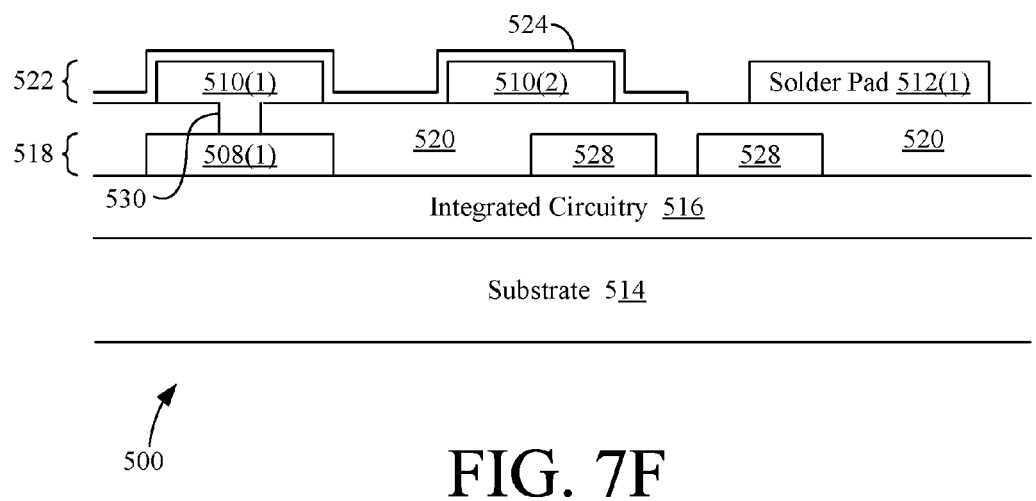
Figure 7G:
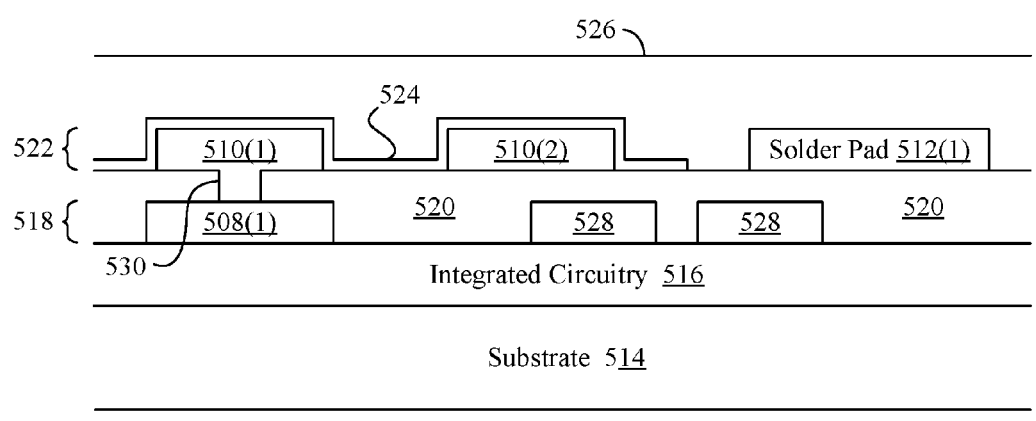
Figure 7H:
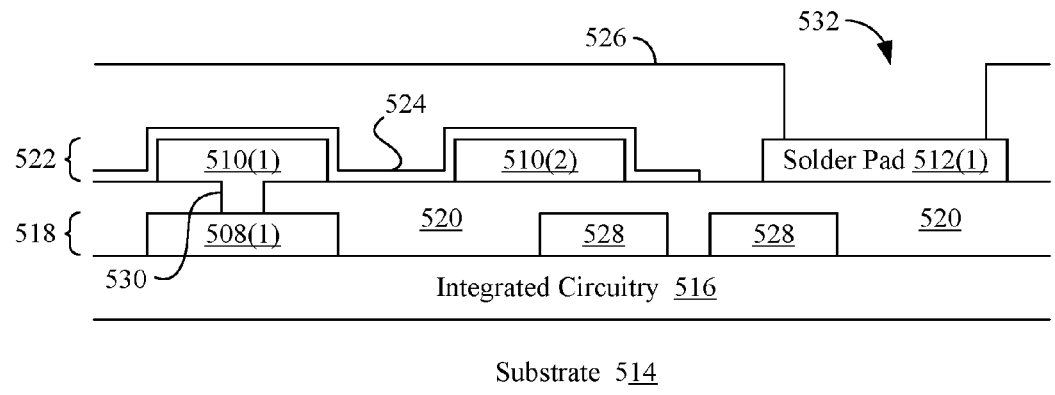
Figure 7I:
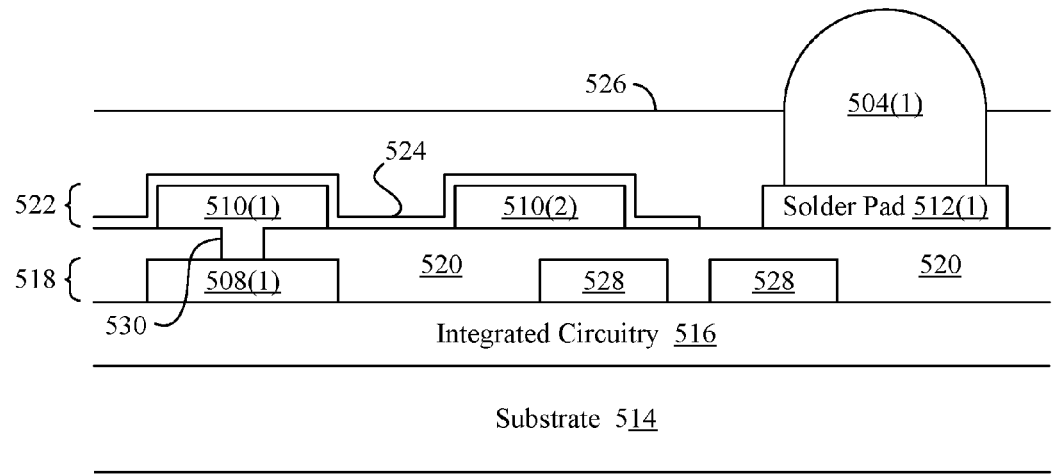

FIGS. 7A-7I show microchip 500 at various stages of manufacture. FIG. 7A shows microchip 500 after integrated circuitry 516 and metallization layer 518, including I/O terminals 508 and wiring 528, have been formed on substrate 514 using methods known in the art (e.g., doping, implantation, patterning, sputtering, plating, etc.). FIG. 7B shows microchip 500 after passivation layer 520 has been formed over metallization layer 518 using, for example, PECVD. FIG. 7C shows microchip 500 after vias 530 (only one shown) have been formed in passivation layer 520 (e.g., by photolithography, etching, etc.). FIG. 7D shows microchip 500 after the elements of redistribution layer 522, including redistribution conductors 510 and solder pads 512, have been formed over passivation layer 520 (e.g., by sputtering, plating, etc.). FIG. 7E shows microchip 500 after cap layer 524 has been formed over passivation layer 520, redistribution conductors 510, and solder pads 512 using, for example, PECVD. FIG. 7F shows microchip 500 after cap layer 524 has been removed from atop and around solder pads 512 (e.g., by photolithography, etching, etc.). As mentioned above, removing cap oxide 524 from on and around solder pads 512 prevents negative structural side effects, such as shearing of solder balls 504 from solder pads 512. FIG. 7G shows microchip 500 after a protective layer 526 has been formed from solder mask over cap layer 524 and solder pads 512 (e.g., by a spin-on or spray-coating process, etc.). FIG. 7H shows microchip 500 after vias 532 (only one shown) have been formed over solder pads 512 by removing protective layer 526 therefrom (e.g., by photolithography, etching, etc.). FIG. 7I shows microchip 500 after solder balls 504 have been formed atop solder pads 512.

Figure 8:
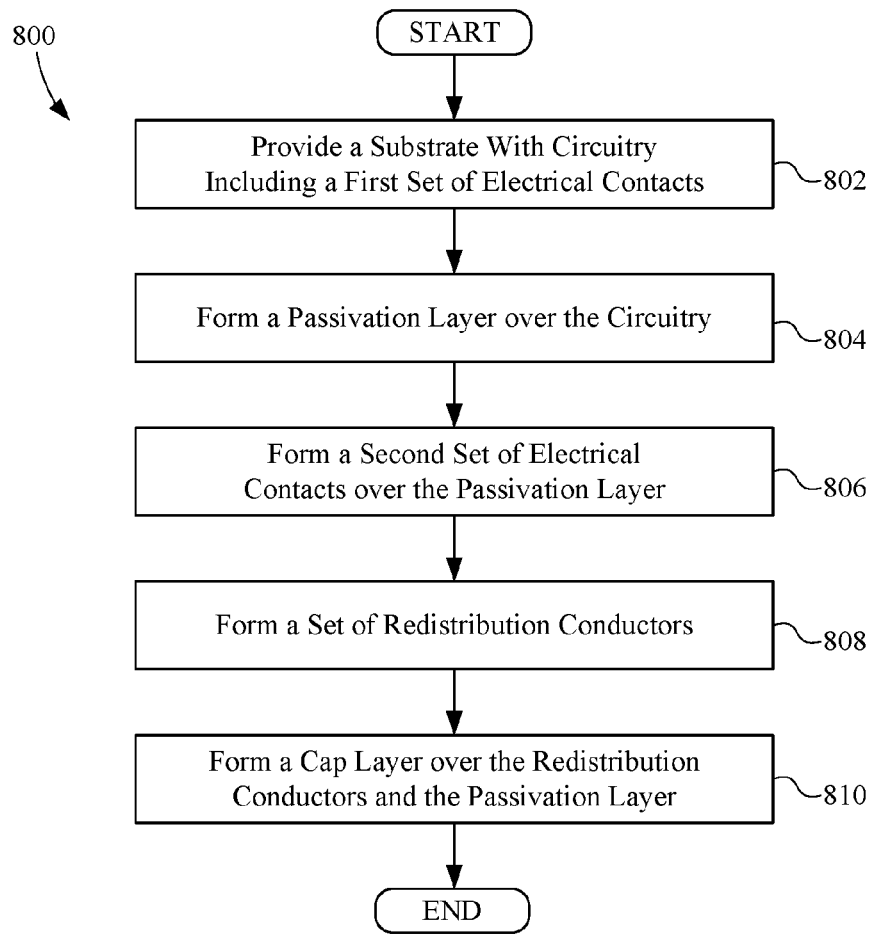
FIG. 8 is a flowchart summarizing an exemplary method of manufacturing a microchip according to the present invention.

FIG. 8 is a flowchart showing an example method 800 for manufacturing a microchip according to the present invention. In a first step 802, a substrate is provided that has circuitry formed thereon, where the circuitry includes a first set of electrical contacts configured to communicate with an external device. In a second step 804, a passivation layer (e.g., a first oxide layer) is formed over the circuitry. In a third step 806, a second set of electrical contacts is formed over the passivation layer, where the second set of electrical contacts is configured to be electrically coupled to a set of complementary electrical contacts of an external device (e.g., a PCB, etc.). In a fourth step 808, a set of redistribution conductors is formed over the passivation layer. Each of the redistribution conductors is formed from a conductive material and electrically couples at least one of the electrical contacts of the first set and one of the electrical contacts of the second set. Then, in a fifth step 810, a cap layer (e.g., a second oxide layer) is formed over the set of redistribution conductors and in contact with the passivation layer. The passivation layer and the cap layer have at least one compatibility that facilitates an amount of adhesion therebetween sufficient to prevent migration of the conductive material between the interfaces of the passivation and cap layers.

The description of particular embodiments of the present invention is now complete. Many of the described features may be substituted, altered or omitted without departing from the scope of the invention. For example, the solder pads described herein could be replaced with other types of external device connectors, such as wire bond pads. As another example, multiple cap layers could be formed over the redistribution circuitry and passivation layer. These and other deviations from the particular embodiments shown will be apparent to those skilled in the art, particularly in view of the foregoing disclosure.

We claim:

1. A method of fabricating a microchip, said method comprising:
   providing a substrate having circuitry formed thereon, said circuitry including a first set of electrical contacts configured to communicate with an external device;
   forming a passivation layer over said circuitry;
   forming a second set of electrical contacts over said passivation layer, said second set of electrical contacts configured to be electrically coupled to a set of complementary electrical contacts of said external device;
   forming a plurality of redistribution conductors over said passivation layer, each of said plurality of redistribution conductors formed from a conductive material and electrically coupling at least one of said electrical contacts of said first set and one of said electrical contacts of said second set; and
   forming a contiguous cap layer over said plurality of redistribution conductors and in contact with said passivation layer; and wherein
   said passivation layer and said cap layer have at least one compatibility that facilitates an amount of adhesion therebetween sufficient to prevent migration of said conductive material between adjacent ones of said plurality of redistribution conductors at interfaces of said passivation layer and said cap layer; and
   said cap layer and said passivation layer are formed from the same material.

2. The method of claim 1, wherein each of said passivation layer and said cap layer is formed from an oxide.

3. The method of claim 1, wherein said compatibility comprises type of deposition process.

4. A method of fabricating a microchip, said method comprising:
   providing a substrate having circuitry formed thereon, said circuitry including a first set of electrical contacts configured to communicate with an external device;
   forming a passivation layer over said circuitry;
   forming a second set of electrical contacts over said passivation layer, said second set of electrical contacts configured to be electrically coupled to a set of complementary electrical contacts of said external device;
   forming a set of redistribution conductors over said passivation layer, each of said redistribution conductors formed from a conductive material and electrically coupling at least one of said electrical contacts of said first set and one of said electrical contacts of said second set; and
   forming a cap layer over said set of redistribution conductors and in contact with said passivation layer; and wherein
   said passivation layer and said cap layer have at least one compatibility that facilitates an amount of adhesion therebetween sufficient to prevent migration of said conductive material between interfaces of said passivation layer and said cap layer;

said cap layer and said passivation layer are formed from the same material;
said compatibility comprises type of deposition process; and
said steps of forming said passivation layer and forming said cap layer are accomplished with a same type of deposition process.

5. The method of claim 4, wherein said same deposition process comprises plasma-enhanced chemical vapor deposition (PECVD).

6. The method of claim 1, further comprising:
forming a protective layer over said cap layer; and
said protective layer is formed from a material different than said cap layer.

7. The method of claim 1, wherein each of said electrical contacts of said second set is free of contact with said cap layer.

8. The method of claim 1, wherein said passivation layer provides substantially planarizing step coverage over said circuitry.

9. A microchip comprising:
a substrate having circuitry formed thereon, said circuitry including a first set of electrical contacts configured to communicate with an external device;
a passivation layer formed over said circuitry;
a second set of electrical contacts disposed over said passivation layer, said second set of electrical contacts configured to be electrically coupled to a set of complementary electrical contacts of said external device;
a plurality of redistribution conductors disposed over said passivation layer, each of said plurality of redistribution conductors being formed from a conductive material and electrically coupling at least one of said electrical contacts of said first set and one of said electrical contacts of said second set; and
a contiguous cap layer formed over said plurality of redistribution conductors and in contact with said passivation layer; and wherein
said passivation layer and said cap layer have at least one compatibility that facilitates an amount of adhesion therebetween sufficient to prevent migration of said conductive material between adjacent ones of said plurality of redistribution conductors at interfaces of said passivation layer and said cap layer; and
said cap layer and said passivation layer are formed from the same material.

10. The microchip of claim 9, wherein said passivation layer and said cap layer are oxide layers.

11. The microchip of claim 10, wherein:
said passivation layer has a thickness in the range of 2.0 to 5.0 micrometers; and
said cap layer has a thickness in the range of 0.5 to 2.0 micrometers.

12. The microchip of claim 9, wherein said passivation layer provides substantially planarizing step coverage of said circuitry.

13. A microchip comprising:
a substrate having circuitry formed thereon, said circuitry including a first set of electrical contacts configured to communicate with an external device;
a passivation layer formed over said circuitry;
a second set of electrical contacts disposed over said passivation layer, said second set of electrical contacts configured to be electrically coupled to a set of complementary electrical contacts of said external device;
a set of redistribution conductors disposed over said passivation layer, each of said redistribution conductors being formed from a conductive material and electrically coupling at least one of said electrical contacts of said first set and one of said electrical contacts of said second set; and
a cap layer formed over said set of redistribution conductors and in contact with said passivation layer; and wherein
said passivation layer and said cap layer have at least one compatibility that facilitates an amount of adhesion therebetween sufficient to prevent migration of said conductive material between interfaces of said passivation layer and said cap layer;
said cap layer and said passivation layer are formed from the same material;
said compatibility comprises type of deposition process; and
said passivation layer and said cap layer are formed using the same type of deposition process.

14. The microchip of claim 9, further comprising:
a protective layer over said cap layer; and
said protective layer is formed from a material different than said cap layer.

15. The microchip of claim 9, further comprising a gap between said cap layer and each of said electrical contacts of said second set.

16. A microchip comprising:
a substrate having circuitry formed thereon, said circuitry including a first set of electrical contacts configured to communicate with an external device;
an inorganic passivation layer formed over said circuitry;
a second set of electrical contacts formed over said passivation layer, said second set of electrical contacts configured to be electrically coupled to a set of complementary electrical contacts of said external device;
a plurality of redistribution conductors formed on said passivation layer, each of said plurality of redistribution conductors electrically coupling at least one of said electrical contacts of said first set and one of said electrical contacts of said second set; and
an inorganic cap layer formed contiguously over said plurality of redistribution conductors and in contact with said passivation layer between adjacent ones of said plurality of redistribution conductors, said inorganic cap layer being formed from the same material as said passivation layer and preventing metal migration between said adjacent ones of said plurality of redistribution conductors.

17. The method of claim 1, wherein said cap layer provides uniform step-coverage over each of said plurality of redistribution conductors.

18. The method of claim 17, wherein:
said step of forming said plurality of redistribution conductors over said passivation layer comprises forming said plurality of redistribution conductors directly on said passivation layer;
a top layer of each of said plurality of redistribution conductors is in contact with said passivation layer; and
said cap layer and said passivation layer are formed from a non-metal.

19. The microchip of claim 9, wherein said cap layer provides uniform step-coverage over each of said plurality of redistribution conductors.

20. The microchip of claim 19, wherein:
said plurality of redistribution conductors is formed directly on said passivation layer;
a top layer of each of said plurality of redistribution conductors is in contact with said passivation layer; and said cap layer and said passivation layer are formed from a non-metal.

\* \* \* \* \*